(12) United States Patent
Park et al.

(10) Patent No.: US 10,109,752 B2
(45) Date of Patent: Oct. 23, 2018

(54) NANOWIRE-MODIFIED GRAPHENE AND METHODS OF MAKING AND USING SAME

(71) Applicant: MASSACHUSETTS INSTITUTE OF TECHNOLOGY, Cambridge, MA (US)

(72) Inventors: Hyesung Park, Cambridge, MA (US); Sehoon Chang, Cambridge, MA (US); Jing Kong, Winchester, MA (US); Silvija Gradecak, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 174 days.

(21) Appl. No.: 14/647,422

(22) PCT Filed: Nov. 26, 2013

(86) PCT No.: PCT/US2013/071888
§ 371 (c)(1),
(2) Date: May 26, 2015

(87) PCT Pub. No.: WO2014/082061
PCT Pub. Date: May 30, 2014

(65) Prior Publication Data
US 2015/0311363 A1    Oct. 29, 2015

Related U.S. Application Data

(60) Provisional application No. 61/729,795, filed on Nov. 26, 2012.

(51) Int. Cl.
*H01L 51/00* (2006.01)
*H01L 51/44* (2006.01)
(Continued)

(52) U.S. Cl.
CPC ...... *H01L 31/022483* (2013.01); *B82Y 10/00* (2013.01); *C08G 61/126* (2013.01);
(Continued)

(58) Field of Classification Search
CPC ............. H01L 31/02; H01L 31/0224; H01L 31/022425; H01L 31/022466;
(Continued)

(56) References Cited

U.S. PATENT DOCUMENTS

| 9,315,617 B2 * | 4/2016 | Meyer ................. C09D 125/18 |
| 2005/0009224 A1 * | 1/2005 | Yang ................... H01L 21/0237 438/57 |

(Continued)

FOREIGN PATENT DOCUMENTS

WO    WO 2013/181215    12/2013

OTHER PUBLICATIONS

Almohsin, S. Abdul, et al., "Graphene-Enriched P3HT and Porphyrin-Modified ZnO Nanowire Arrays for Hybrid Solar Cell Applications," *The Journal of Physical Chemistry* (2012) vol. 116, pp. 9433-9438.

(Continued)

*Primary Examiner* — Susan D Leong
(74) *Attorney, Agent, or Firm* — Steptoe & Johnson LLP

(57) ABSTRACT

A transparent electrode can include a graphene sheet on a substrate, a layer including a conductive polymer disposed over the graphene sheet, and a plurality of semiconducting nanowires, such as ZnO nanowires, disposed over the layer including the conductive polymer.

19 Claims, 12 Drawing Sheets

(51) Int. Cl.
*H01L 51/42* (2006.01)
*H01L 31/18* (2006.01)
*H01L 31/0224* (2006.01)
*C08G 61/12* (2006.01)
*B82Y 10/00* (2011.01)
*H01L 31/0296* (2006.01)
*H01L 31/032* (2006.01)
*H01L 31/0352* (2006.01)
*H01L 33/40* (2010.01)
*H01L 31/0256* (2006.01)

(52) U.S. Cl.
CPC ...... *H01L 31/0296* (2013.01); *H01L 31/0324* (2013.01); *H01L 31/035218* (2013.01); *H01L 31/035227* (2013.01); *H01L 31/1884* (2013.01); *H01L 51/0021* (2013.01); *H01L 51/4233* (2013.01); *H01L 51/442* (2013.01); *C08G 2261/1412* (2013.01); *C08G 2261/3223* (2013.01); *C08G 2261/91* (2013.01); *H01L 33/40* (2013.01); *H01L 51/0036* (2013.01); *H01L 51/0037* (2013.01); *H01L 51/0045* (2013.01); *H01L 51/4266* (2013.01); *H01L 2031/0344* (2013.01); *H01L 2251/305* (2013.01); *Y02E 10/549* (2013.01); *Y02P 70/521* (2015.11)

(58) Field of Classification Search
CPC ......... H01L 31/022483; H01L 31/0352; H01L 31/18; H01L 31/1884; H01L 51/0021; H01L 51/4233; H01L 51/441; H01L 51/442; H01L 51/4266; H01L 51/0037; H01L 51/0036; B82Y 10/00
See application file for complete search history.

(56) References Cited

U.S. PATENT DOCUMENTS

2012/0141799 A1* 6/2012 Kub ............... B82Y 30/00
428/408
2012/0330044 A1* 12/2012 Hou ............... B82Y 30/00
556/9

OTHER PUBLICATIONS

Park, Hyesung, et al., "Graphene Cathode-Based ZnO Nanowire Hybrid Solar Cells," *NANO Letters* (2013) vol. 13 pp. 233-239.
Alver, U., et al., "Applied Surface Science Optical and Structural Properties of ZnO nanorods grown on grapheme oxide and reduced grapheme oxide film by hydrothermal method," *NANO Letters* (2012) pp. 3109-3114.
PCT/US2013/071888 Search Report and Written Opinion dated Jan. 27, 2014.

* cited by examiner

US 10,109,752 B2

NANOWIRE-MODIFIED GRAPHENE AND METHODS OF MAKING AND USING SAME

CLAIM OF PRIORITY

This application claims the benefit under 35 USC 371 to International Application No. PCT/US2013/071888, filed Nov. 26, 2013, which claims priority to U.S. Provisional Application No. 61/729,795, filed Nov. 26, 2012, each of which is incorporated by reference in its entirety.

TECHNICAL FIELD

The present invention relates to nanowire-modified graphene and methods of making and using the nanowire-modified graphene.

BACKGROUND

The recent discovery and successful large-area synthesis of graphene, with its unique physical properties, have led to a growing interest in its application for optoelectronic devices such as solar cells and light-emitting diodes. Because of its high transparency and electrical conductivity, chemical and mechanical robustness, as well as materials abundance, graphene is being explored as a potential replacement for indium tin oxide (ITO) as a transparent conducting electrode material. Simultaneously with the graphene development, single-crystalline semiconducting nanowires have been widely investigated due to their novel electrical and optical properties. In particular, nanowire-based hybrid photovoltaic (PV) structures have gained significant interest because of their potential to achieve efficient charge extraction via one-dimensional charge transport pathways and large interfacial area in well-ordered bulk heterojunction geometry. An effective interface between nanowires and graphene that maintains the advantages of each component is desirable.

SUMMARY

In one aspect, a transparent electrode includes a graphene sheet on a substrate; an interlayer including a conductive polymer disposed over the graphene sheet; and a plurality of semiconducting nanowires disposed over the interlayer.

The plurality of semiconducting nanowires can be substantially parallel to one another. The long axes of plurality of semiconducting nanowires can be substantially perpendicular to the graphene sheet. The plurality of semiconducting nanowires can include ZnO. The interlayer can include a conductive polymer, such as a polythiophene, polyaniline or polypyrrole, for example, an alkyloxy-substituted polythiophene such as poly(3,4-ethylenedioxythiophene) block bis-poly(ethyleneglycol), poly(thiophene-3-[2-(2-methoxyethoxy)ethoxy]-2,5-diyl), PEDOT:PEG(PC) or RG-1200. A device including the electrode can further include a photoactive material disposed over the plurality of semiconducting nanowires. The photoactive material can include quantum dots or P3HT. The device can further include a second electrode deposited over the photoactive material.

In another aspect, a method of making a transparent electrode includes providing a graphene sheet on a substrate; depositing an interlayer including a conductive polymer disposed over the graphene sheet; and growing a plurality of semiconducting nanowires over the interlayer.

Depositing the interlayer can include spin-casting. Growing the plurality of semiconducting nanowires over the interlayer can include a hydrothermal deposition. The plurality of semiconducting nanowires can include ZnO. The interlayer can include a conductive polymer, such as a polythiophene, polyaniline or polypyrrole, for example, an alkyloxy-substituted polythiophene such as poly(3,4-ethylenedioxythiophene) block bis-poly(ethyleneglycol), poly(thiophene-3-[2-(2-methoxyethoxy)ethoxy]-2,5-diyl), PEDOT:PEG(PC) or RG-1200. The method can further include depositing a photoactive material disposed over the plurality of semiconducting nanowires. The photoactive material can include quantum dots or P3HT. The method can further include depositing a second electrode over the photoactive material.

In another aspect, a photovoltaic device includes a graphene sheet on a substrate; an interlayer including a conductive polymer disposed over the graphene sheet; and a plurality of semiconducting nanowires disposed over the interlayer.

The photovoltaic device further includes a photoactive material disposed over the plurality of semiconducting nanowires. The plurality of semiconducting nanowires can include ZnO.

In another aspect, a method of generating electricity includes illuminating the photovoltaic device.

Other aspects, embodiments, and features will be apparent from the following description, the drawings, and the claims.

BRIEF DESCRIPTION OF THE DRAWINGS

Referring to FIGS. 1A-1D show bright-field optical microscopy images of (a) graphene strip on a quartz substrate; (b) ZnO seed layer spin-coated on pristine graphene showing dewetting of the ZnO film to form islands; (c,d) graphene/PEDOT:PEG(PC) before and after the ZnO seed layer deposition, respectively; and (e,f) graphene/RG-1200 before and after the ZnO seed layer deposition, respectively. FIGS. 1C-1F illustrate uniform coverage of both polymers on the graphene surface and of the ZnO seed layer on the modified graphene.

FIGS. 2A-2F show tapping mode AFM images of (a) ITO/ZnO; (b) graphene; (c,d) graphene/PEDOT:PEG (PC) before and after the ZnO seed deposition, respectively; (e,f), graphene/RG-1200 before and after the ZnO seed deposition, respectively. Both polymers completely coat the graphene surface (c,e) and ZnO conformally covers the underlying polymers (d,f). In addition, surfaces of both polymers are smoothed upon deposition of ZnO layers: the rms roughness is reduced from 34 nm to 25 nm for PEDOT: PEG(PC) and from 6 nm to 2 nm for RG-1200.

FIGS. 3A-3C show hydrothermally grown ZnO nanowire arrays on (a) ITO substrates; (b) graphene/PEDOT:PEG(PC); and (c) graphene/RG-1200. ZnO nanowire arrays grown under the same experimental conditions on ITO and modified graphene show similar uniformity and alignment.

FIGS. 4A and 4B show (a) PL spectra of ZnO nanowires grown on ITO, graphene/PEDOT: PEG(PC), and graphene/RG-1200. In all cases, the low PL intensity of the broad 550 nm peak confirms a low defect density related to hydroxyl groups, and strong near band edge luminescence centered at 376 nm confirms the structural quality of the ZnO nanowires. (b) High-resolution TEM image and the corresponding Fourier transform (inset) show the single-crystalline wurtzite structure of ZnO nanowires, with a lattice spacing of 0.52 nm in the [0001] growth direction.

FIG. 5 represents Raman analysis of PEDOT:PEG(PC) polymer and its hybrid counterparts.

FIGS. 6A-6D show (a) Schematic diagram of the graphene cathode hybrid solar cells: graphene deposited on quartz is covered by a polymer (PEDOT:PEG(PC) or RG-1200), followed by the ZnO seed layer and 400 nm long ZnO nanowires. The nanowires are then infiltrated and covered with PbS QDs (300 nm) or P3HT (700 nm), and finally with $MoO_3$ (25 nm)/Au (100 nm) top electrodes. (b) Flat-band energy level diagram of the solar cells shown in (a). (c) J-V characteristics under 100 mW/$cm^2$ AM1.5G illumination of the champion graphene-based PbS QD device with different polymer interlayers, demonstrating performance comparable to that of an ITO reference cell. (d) J-V characteristics of representative graphene-based P3HT devices with different polymer interlayers, compared with an ITO reference device. Insets in (c) and (d) show SEM cross-section images of the complete devices, showing substantial infiltration of the photoactive materials (PbS QD or P3HT) into the nanometer-scale gaps between ZnO nanowires.

FIGS. 8A and 8B show (a) The morphology of a ZnO seed layer spin-coated directly on graphene surface shows non-uniformity due to the poor wetting of zinc acetate hexahydrate. (b) ZnO nanowires grown on as-prepared graphene/ZnO show poor alignment and low areal density.

DETAILED DESCRIPTION

Combining the properties of graphene and semiconducting nanowires can thus provide a unique platform for the development of nanostructured solar cells with superior transparency and flexibility, as well as improved stability.

Single-crystalline semiconducting nanowires for optoelectronic applications can be grown by a variety of techniques, including metal organic vapor phase epitaxy (MOVPE), molecular beam epitaxy, and solution-based hydrothermal processes. These methods enable direct growth of nanowires on various conductive substrates such as aluminum foil or ITO, as well as on cost-effective flexible substrates. However, growing 1D semiconducting nanostructures directly on pristine graphene without impairing its electrical and structural properties has been challenging, due to graphene's stable and inert $sp^2$-hybridized structure. For example, high temperature (~400° C.) MOVPE growth of ZnO nanowires on graphene requires destructive oxygen plasma treatment of the graphene substrate to break the $sp^2$ hybridized graphene surface and generate step edges that act as ZnO nanowire nucleation sites (refs. 19-20).

Figure 1:
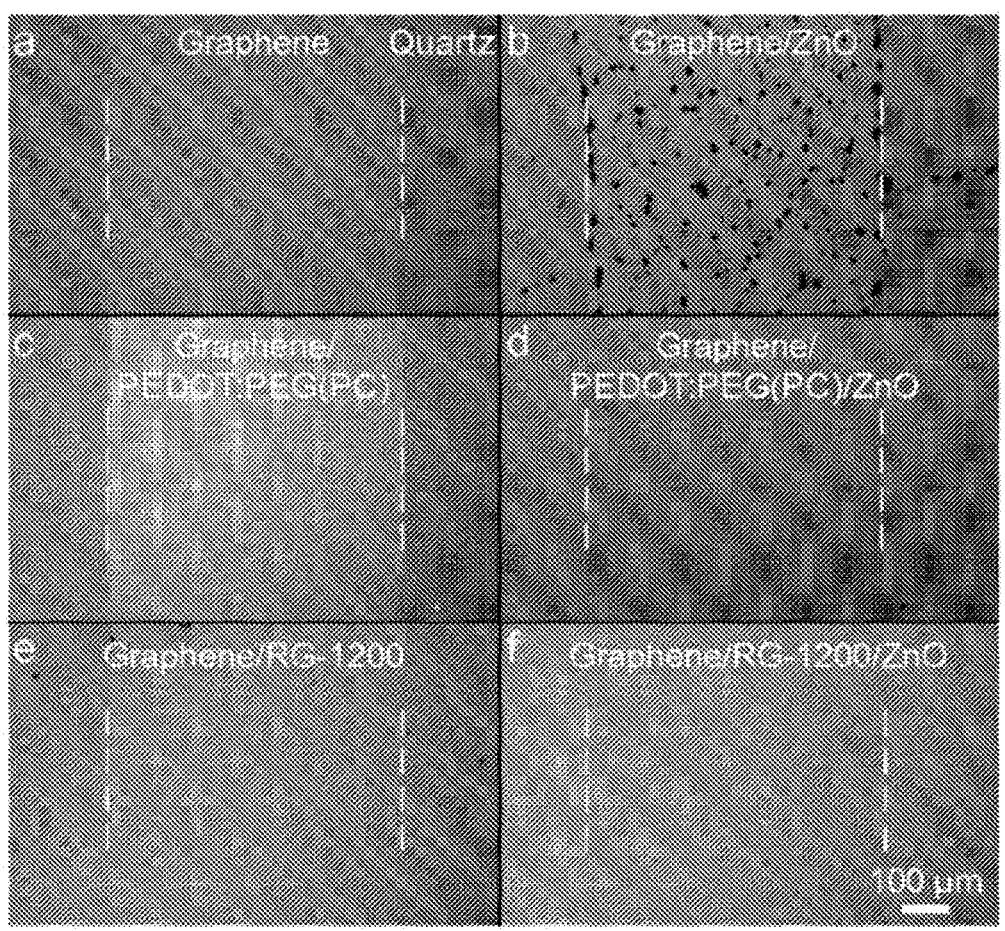
FIG. 1 represents ZnO seed layer wetting properties on the modified graphene substrates.
Figure 1G:
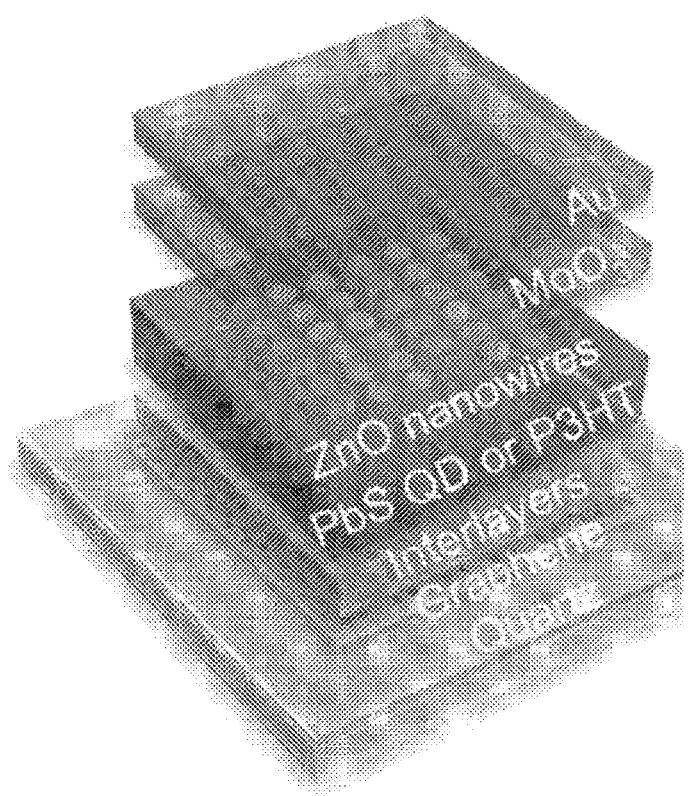
FIG. 1G is a schematic illustration of a graphene cathode-based solar cell.

With regard to FIG. 1, a transparent photovoltaic device includes a substrate (e.g., quartz) supports a graphene layer upon which one or more interlayers is arranged. At least one interlayer includes a conducting polymer. A plurality of semiconducting nanowires is disposed on the one or more interlayers. A photoactive material is deposited over the semiconductor nanowires. A conducting layer (e.g., including $MoO_3$ and Au layers) is arranged over this structure.

A "wire" generally refers to any material having a conductivity of any semiconductor or any metal, and in some embodiments can connect two electronic components such that they are in electronic communication with each other. For example, the term "electrically conductive" or a "conductor" or an "electrical conductor" when used with reference to a "conducting" wire or a nanoscale wire, refers to the ability of that wire to pass charge. Preferred electrically conductive materials have a resistivity lower than about $10^{-3}$, more preferably lower than about $10^{-4}$, and most preferably lower than about $10^{-6}$ or $10^{-7}$ Ωm.

A "nanoscopic wire" (also known herein as a "nanoscopic-scale wire" or "nanoscale wire" or simply "nanowire") generally is a wire, that at any point along its length, has at least one cross-sectional dimension and, in some embodiments, two orthogonal cross-sectional dimensions less than 1 µm, less than about 500 nm, less than about 200 nm, less than about 150 nm, less than about 100 nm, less than about 70, less than about 50 nm, less than about 20 nm, less than about 10 nm, or even less than about 5 nm. The nanoscale wire can have at least one cross-sectional dimension ranging from 0.5 nm to 200 nm. Where nanoscale wires are described having, for example, a core and an outer region, the above dimensions generally relate to those of the core. The cross-section of the elongated semiconductor may have any arbitrary shape, including, but not limited to, circular, square, rectangular, tubular, or elliptical, and may a regular or an irregular shape.

Exemplary materials for forming a nanowire include main group and metal atom-elements, transition metal-containing wires, gallium arsenide, gallium nitride, indium phosphide, germanium, cadmium selenide structures.

The nanowire can include an elemental semiconductor, such as Si, Ge, Sn, Se, Te, B, C (i.e., diamond), or P. The nanowire can include a solid solution of elemental semiconductors, such as B—C, B—P($BP_6$), B—Si, Si—C, Si—Ge, Si—Sn or Ge—Sn.

The nanowire can include a Group III-Group V semiconductor such as BN, BP, BAs, AlN, AlP, AlAs, AlSb, GaN, GaP, GaAs, GaSb, InN, InP, InAs, or InSb. The nanowire can include an alloy of two or more Group III-Group V. The nanowire can include a Group II-Group VI semiconductor, such as ZnO, ZnS, ZnSe, ZnTe, CdS, CdSe, CdTe, HgS, HgSe, HgTe, BeS, BeSe, BeTe, MgS, or MgSe. The nanowire can include an alloy of two or more Group II-Group VI semiconductors. The nanowire can include an alloy of a Group II-Group VI semiconductor and a Group III-Group V semiconductor. The nanowire can include a Group IV-Group VI semiconductor, such as GeS, GeSe, GeTe, SnS, SnSe, SnTe, PbO, PbS, PbSe, or PbTe. The nanowire can include a Group I-Group VII semiconductor, such as CuF, CuCl, CuBr, CuI, AgF, AgCl, AgBr, or AgI. The nanowire can include a semiconductor such as $BeSiN_2$, $CaCN_2$, $ZnGeP_2$, $CdSnAs_2$, $ZnSnSb_2$, $CuGeP_3$, $CuSi_2P_3$, $(Cu, Ag)(Al, Ga, In, Tl, Fe)(S, Se, Te)_2$, $Si_3N_4$, $Ge_3N_4$, $Al_2O_3$, $(Al, Ga, In)_2(S, Se, Te)_3$, or $Al_2CO$.

A wide variety of these and other nanoscale wires can be grown on and/or applied to surfaces in patterns useful for electronic devices. The nanoscale wires can be at least 100 nm, at least 200 nm, at least 300 nm, at least 400 nm, at least 500 nm, at least 1 µm, at least 3 µm, at least 5 µm, or at least 10 or 20 µm in length. The nanoscale wires can be less than about 100 nm, less than about 75 nm, less than about 50 nm, or less than about 25 nm in thickness (height and width). The wires can have an aspect ratio (length to thickness) of at least about 2:1, greater than about 10:1, or greater than about 100:1.

Semiconducting nanowires such as, for example, ZnO or $TiO_2$ can be grown on graphene via a hydrothermal method. In particular, the semiconducting nanowires can be in electrical communication with the graphene, without impairing the electrical properties of either the graphene or the semiconducting nanowires. Hydrothermal methods of making semiconductor nanowires are described in, e.g., refs. 22-24.

In some embodiments, zinc oxide (ZnO) nanowires can be advantageous because of their low-temperature processability over a large area, structural robustness, and excellent lattice-matching with graphene (ref. 25).

The electrical properties of nanowires-on-graphene, in particular, a nanowires-on-graphene electrode, can be enhanced if the graphene is provided with an interfacial modification prior to growth of semiconducting nanowires on the graphene layer. Hybrid solar cells incorporating such electrodes (e.g., as cathode) can be manufactured using solution-processed photoactive materials (e.g. semiconductor nanocrystals (quantum dots (QDs), conjugated polymers) as hole transport layers, and the semiconducting nanowires as electron transport layers.

The interfacial modification can include applying one or more interlayers that bridge the graphene layer and the semiconductor nanowires. The interlayers can include materials that wet the graphene surface; provide a surface that is more chemically compatible with semiconductor nanowires than the graphene layer; and to facilitate electrical communication (e.g., charge transfer) between the graphene and the semiconductor nanowires.

The interlayer(s) can include one or more conducting or semiconducting polymers to facilitate electrical communication between the graphene and the semiconductor nanowires. The interlayer(s) can include other materials, such as other polymers, to facilitate wetting of the graphene surface and enhance chemical compatibility. The interlayers can be deposited by simple solution-based methods, such as spin-coating of a polymer solution in a suitable solvent. The solvent can be chosen for its ability to solubilize the interlayer material(s) and for its graphene-wetting properties. For example, nitromethane can be a suitable solvent for PEDOT: PEG(PC) (poly(3,4-ethylenedioxythiophene)-block-poly (ethylene glycol) (PEDOT:PEG) doped with perchlorate (PC)), and ethylene glycol monobutyl ether (e.g., as a mixture with water) can be a suitable solvent for RG-1200 (sulfonated poly(thiophene-3-[2-(2-methoxyethoxy) ethoxy]-2,5-diyl)). The interlayer-modified graphene can be further modified with a uniform deposition of semiconductor nanowires. See, for example, (FIGS. 1C-1F).

The interlayer for graphene can be selected by selecting materials that wet the graphene surface, provide a chemically compatible surface with the subsequent layer, and enable charge transfer at the interface (for example, by matching the work function of the graphene and other carriers). For example, soluble polymers that can be dissolved in a solvent suitable for spin coating on a graphene surface. The soluble polymer can be a polythiophene derivatives that can be dissolved in a solvent (for example, ethylene glycol monobutyl ether/water or nitromethane) to form uniform film on top of the graphene surface. The polythiophene derivatives can be alkyl (e.g., C1-C16) or alkoxy (e.g., C1-C16 alkoxy), or polyalkyloxy (e.g., C1-C16 including one, two, three or four interrupting oxygen atoms). The polythiophene-based conductive polymers have a good wetting property on graphene surface and enable charge transfer between ZnO (nanowire) and graphene electrode. Other soluble conductive polymers could be used. Examples of conducting polymers which may be suitable for use in the interlayer include polythiophene, polyaniline (PA), polypyrrole, polyethylenedioxythiophene, and derivatives thereof. For example, the conductive polymer can be an alkyloxy-substituted polythiophene such as poly(3,4-ethylenedioxy-thiophene) block bis-poly(ethyleneglycol), poly(thiophene-3-[2-(2-methoxyethoxy)ethoxy]-2,5-diyl).

More than one conducting polymer can be used in the interlayer.

EXAMPLES

Results and Discussion

Figure 7:
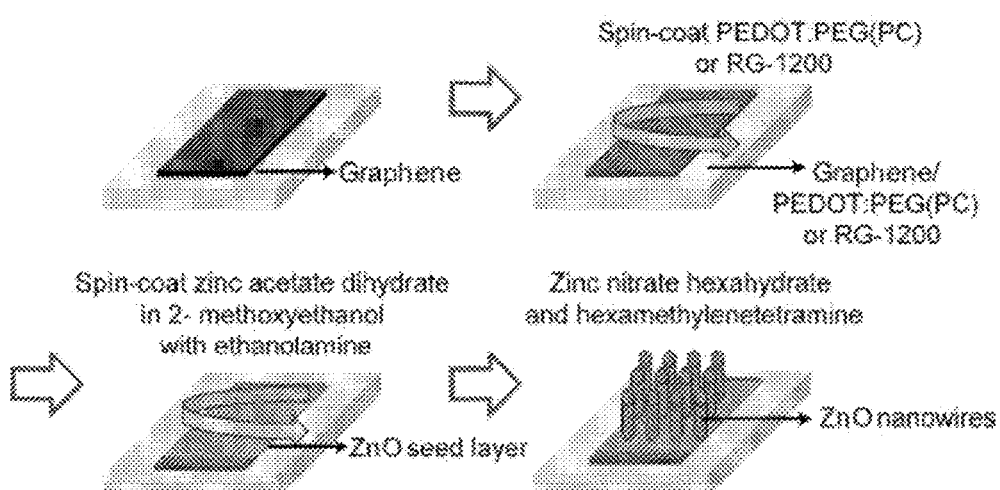
FIG. 7 Represents a schematic diagram of the hydrothermal ZnO nanowire growth on graphene electrodes modified with conductive polymer interlayers. PEDOT:PEG(PC) or RG-1200 were spin-coated on the pristine graphene. Subsequently, ZnO seed layers were deposited on graphene/ PEDOT:PEG(PC) (or graphene/RG-1200) by spin-coating 300 mM of zinc acetate dihydrate in 2-methoxyethanol with ethanolamine. After annealing the seed layer at 175° C. for 10 min, ZnO nanowire arrays were grown by immersing the substrates into the growth solution (50 mM of zinc nitrate hexahydrate (25 ml)+50 mM of hexamethylenetetramine (25 ml) in DI water).
Figure 8:
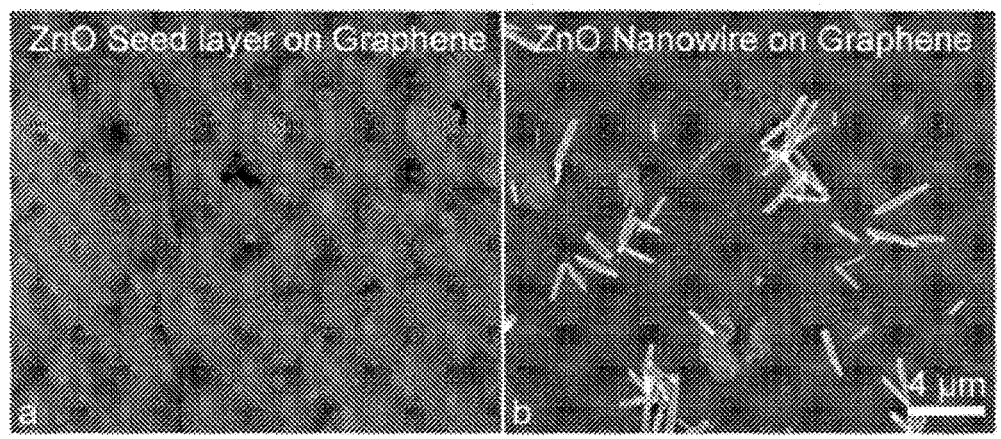
FIG. 8 represents scanning electron microscopy (SEM) images of ZnO seed layer and ZnO nanowires grown on pristine graphene.

ZnO nanowires were grown via a hydrothermal method on graphene and, for comparison, on ITO substrates, and both architectures were used for subsequent device fabrication and testing (FIG. 7). Graphene sheets were synthesized via low-pressure chemical vapor deposition and the graphene electrodes were fabricated through a layer-by-layer transfer method by stacking three monolayers of graphene films (ref. 9; FIG. 1A). The resulting average sheet resistance and transmittance values were 300±12 Ω/□ and 92.0±0.4% (at λ=550 nm), respectively, similar to those reported elsewhere (ref. 14). Hydrothermal growth of ZnO nanowires involves the deposition of a uniform, high-quality ZnO seed layer, which can be obtained by, for example, annealing a layer of zinc acetate dihydrate in 2-methoxyethanol spin-coated on the growth substrate. In the case of ITO, this process yields a uniform ZnO film. On a pristine graphene surface, however, the low surface free energy and the hydrophobic nature of graphene result in poor wetting by the ZnO seed layer and the formation of dewetted ZnO islands (refs. 9 and 26, FIGS. 1B and 8). Similar poor wetting of graphene has been reported with other material systems, such as poly(3,4-ethylenedioxythiophene):poly(styrenesulfonate) (PEDOT:PSS) in aqueous solution, which is commonly used as a hole injection layer. A non-destructive modification of the graphene surface with a suitable interlayer can allow uniform deposition of the ZnO seed layer.

Figure 9:
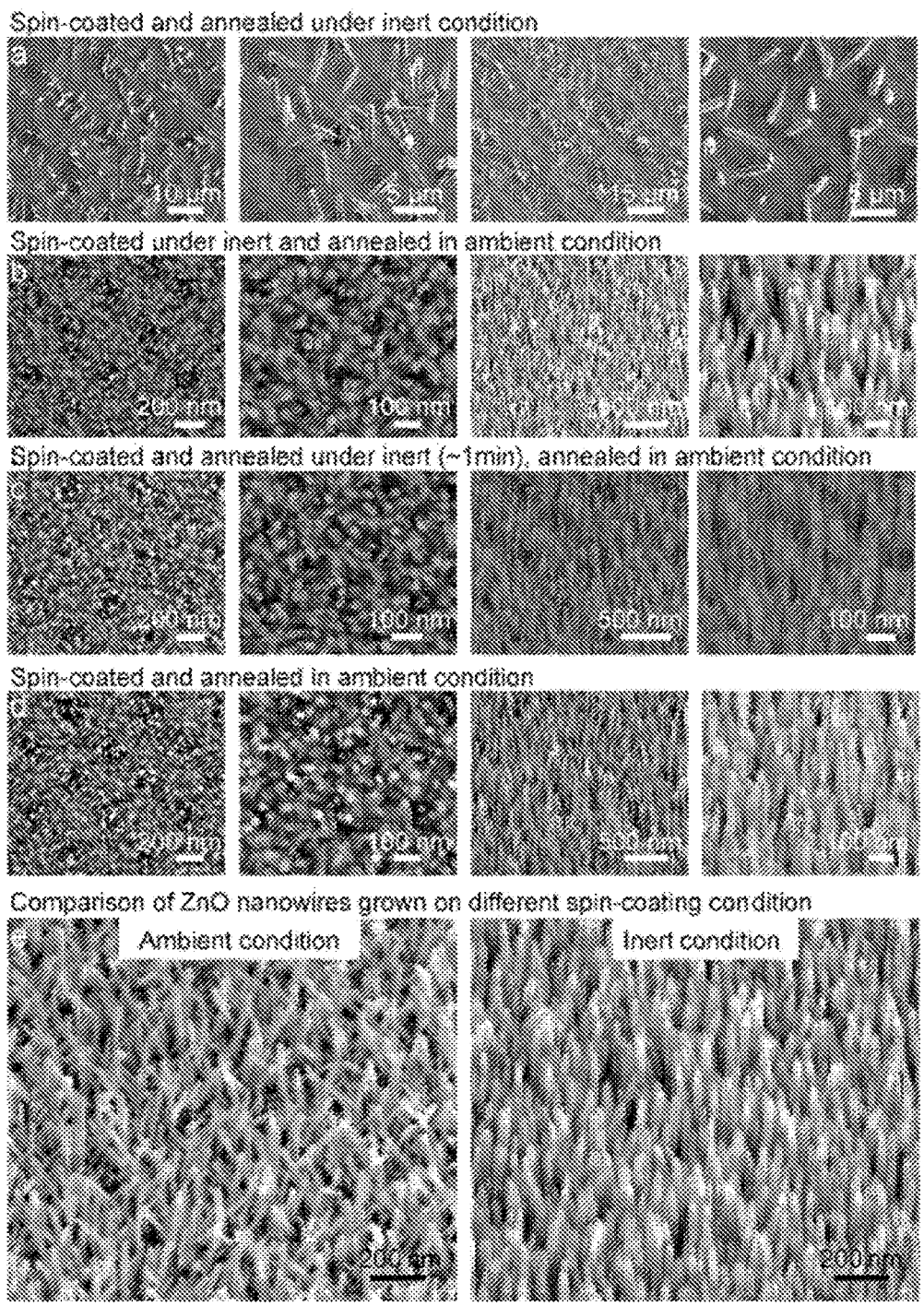
FIG. 9 represents SEM images of ZnO nanowires grown on spin-coated ZnO seed layer on ITO. ZnO seed layers were: (a) Spin-coated and annealed under inert nitrogen atmosphere; (b) Spin-coated under inert nitrogen atmosphere and annealed in ambient condition; (c) Spin-coated and annealed for ~1 min under inert nitrogen atmosphere and then annealed in ambient condition for 9 min; (d) Spin-coated and annealed in ambient condition; (e) Comparison of ZnO nanowires grown on spin-coated ZnO seed layers in ambient condition and inert nitrogen atmosphere, illustrating more uniform growth is achieved in inert atmosphere. As a result of this analysis, ZnO seed layers were optimized by spin-coating zinc acetate dihydrate in 2-methoxyethanol at 4000 rpm for 60 s, and annealing at 175° C. under inert nitrogen atmosphere. The seed layer deposition was performed twice to ensure complete coverage. ZnO seed layers prepared by spin-coating under inert nitrogen atmosphere and annealing in ambient condition resulted in well-aligned, uniform growth of ZnO nanowire arrays over a large area.
Figure 10:
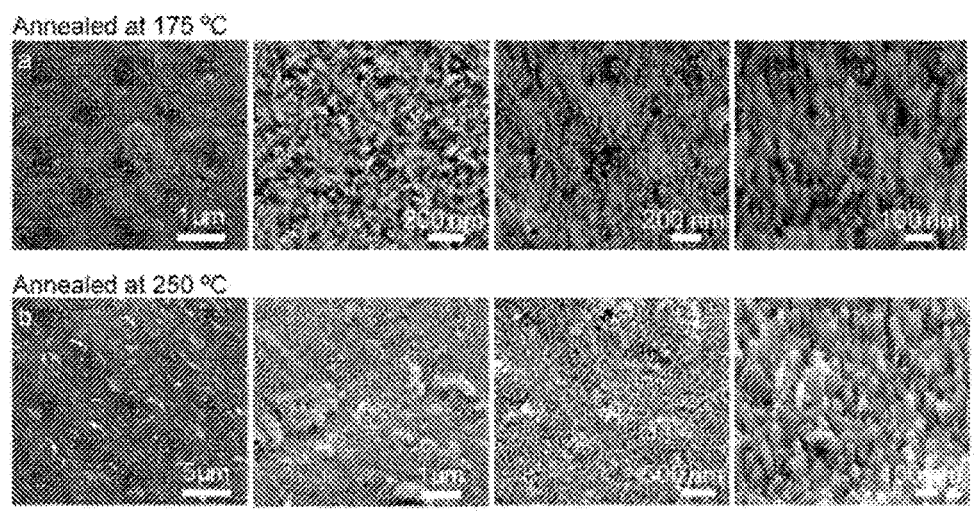
FIG. 10 represents SEM images of ZnO nanowires grown on a graphene/PEDOT:PEG(PC)/ZnO seed layer annealed at different temperatures. (a) The morphology of ZnO nanowires grown on a graphene/PEDOT:PEG(PC)/ZnO seed layers annealed at 175° C. was relatively smooth. (b) In contrast, the morphology of ZnO nanowires grown on a graphene/PEDOT:PEG(PC)/ZnO seed layer annealed at 250° C. was significantly wrinkled due to the thermal degradation of PEDOT:PEG(PC) at the elevated temperature.

The growth of uniform and ordered ZnO nanowire arrays can be highly dependent on the uniformity of the ZnO seed layer, which is in turn strongly affected by the annealing temperature and ambient conditions (ref. 22; FIG. 9). A ZnO seed layer can be obtained by thermal decomposition of zinc acetate dihydrate at temperatures above the solid sublimation temperature (~175° C.). Since a full transformation to ZnO occurs at 335° C., annealing conditions are typically selected to be in the 175-335° C. temperature range (ref. 22). Annealing the polymer interlayers above their thermal degradation temperature (e.g., ~235° C. for PEDOT, ref. 28) can affect their morphology and conductivity. When ZnO seed layers on PEDOT were annealed at temperatures above 235° C., the uniformity and morphology of the resulting ZnO nanowire arrays were significantly altered due to wrinkling of the underlying polymer (FIG. 10). Therefore, the annealing temperature of the seed layer was held below this value to maintain the structural integrity and electrical properties of the interlayer, as well as the quality of the ZnO nanowires.

Figure 2:
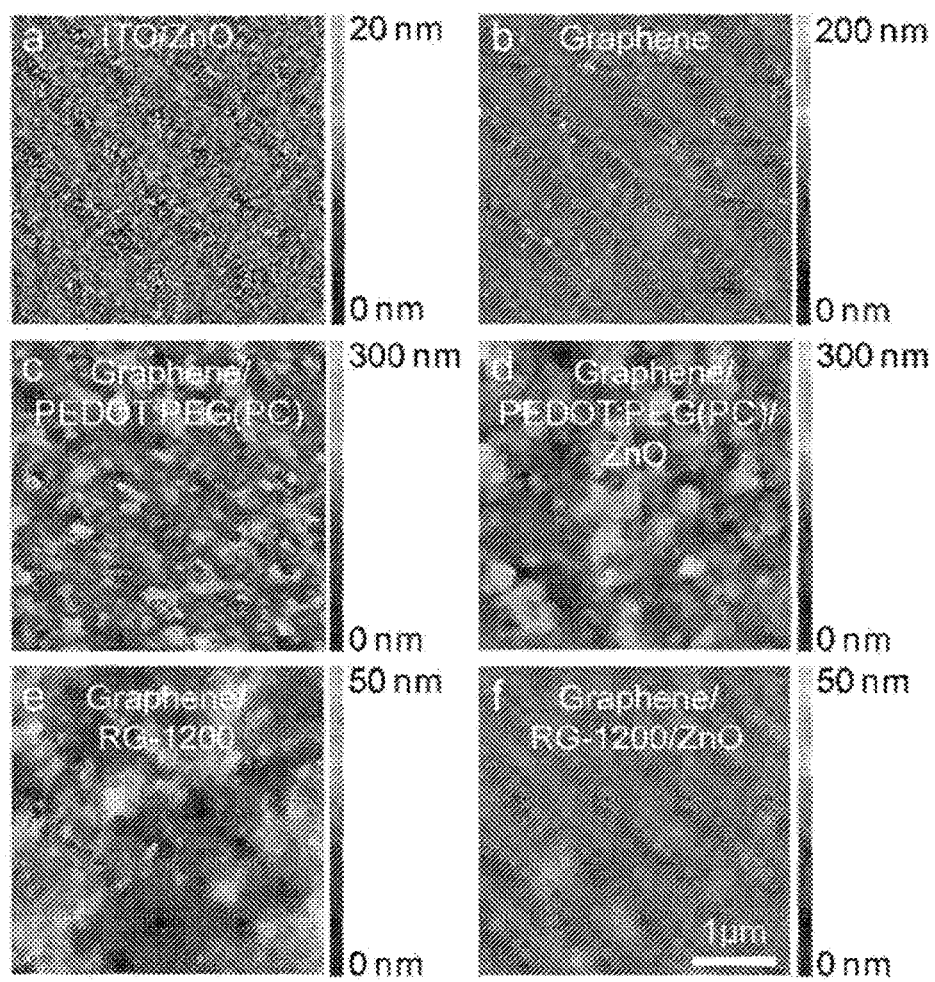
FIG. 2 represents surface morphology analysis of ZnO seed layers on graphene transferred on ITO and graphene substrates.
Figure 3:
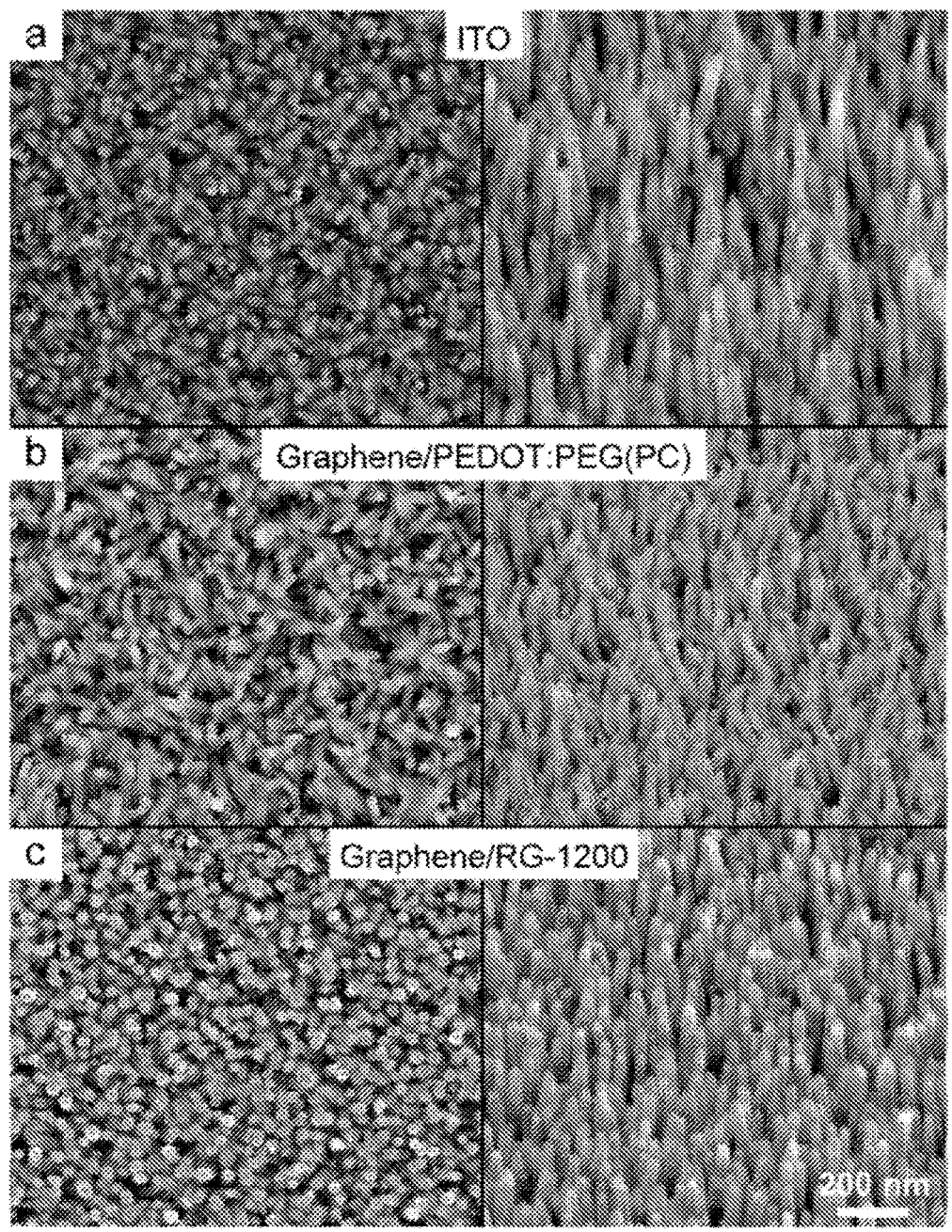
FIG. 3 represents SEM characterization of ZnO nanowire arrays grown on ITO and on graphene modified with polymer interfacial layers.

In addition to the annealing temperature, the choice of interfacial polymer can affect the morphology of the ZnO seed layer. To characterize any morphological changes, the surface of ZnO films on the modified graphene surfaces, and on ITO for comparison, was investigated by atomic force microscopy (AFM). Acetate-derived ZnO seed layers on ITO were uniform and smooth, with a root-mean-square (rms) roughness of less than 2 nm (FIG. 2A), and yielded well-ordered ZnO nanowire arrays (FIG. 3A). The surface of pristine graphene (FIG. 2B) after deposition of PEDOT:PEG(PC) showed a rms roughness of 34 nm (FIG. 2C), which decreased to 24 nm after the deposition of a conformal ZnO seed layer (FIG. 2D). Similar trends were observed for graphene films modified with RG-1200, but the surface was smoother than in the case of PEDOT:PEG(PC), with measured rms roughness values for graphene/RG-1200 and graphene/RG-1200/ZnO of 6 and 2 nm, respectively (FIGS. 2D-2E). FIG. 3 shows SEM images of ZnO nanowire arrays grown on ITO and on modified graphene under identical conditions. Notably, the morphology of nanowires grown on the modified graphene substrates was comparable to that obtained on ITO. ZnO nanowire arrays grown on a graphene/RG-1200 substrate exhibited better nanowire alignment (order parameter $S_{RG-1200}$=0.992) than those on a graphene/PEDOT:PEG(PC) substrate ($S_{PEDOT:PEG(PC)}$=0.938) and similar alignment to arrays grown on ITO ($S_{ITO}$=0.997), corroborating the idea that the roughness of the ZnO seed layer affects the alignment of the nanowire arrays. For both polymers, ZnO nanowires grown under identical conditions were approximately 400 nm long and had an average diameter of 20 nm.

Figure 4:
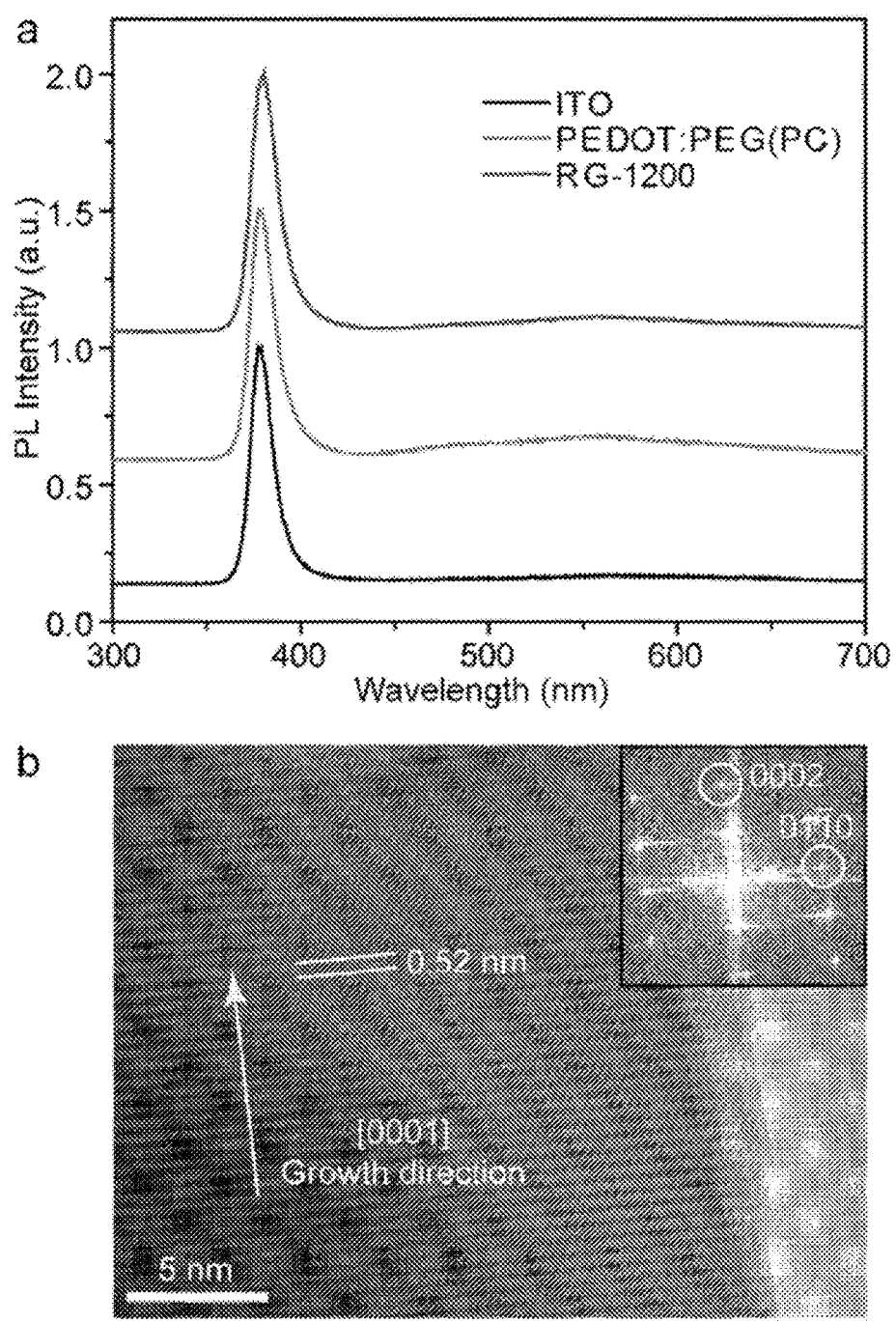
FIG. 4 represents optical and structural characterization of ZnO nanowires on graphene.

To assess the structural and optical quality of as-grown ZnO nanowires on graphene, transmission electron microscopy (TEM) and photoluminescence (PL) measurements were performed (FIG. 4). Strong near band edge emission at 376 nm, as well as a relatively weak defect peak centered at 550-600 nm typically associated with singly-ionized oxygen defects in ZnO nanowires, both confirmed the excellent quality of ZnO nanowires grown on graphene. High-resolution TEM images of ZnO nanowires grown on graphene with polymer interlayers showed well-resolved lattice with a spacing of ~0.52 nm in the [0001] growth direction.

Figure 5A:
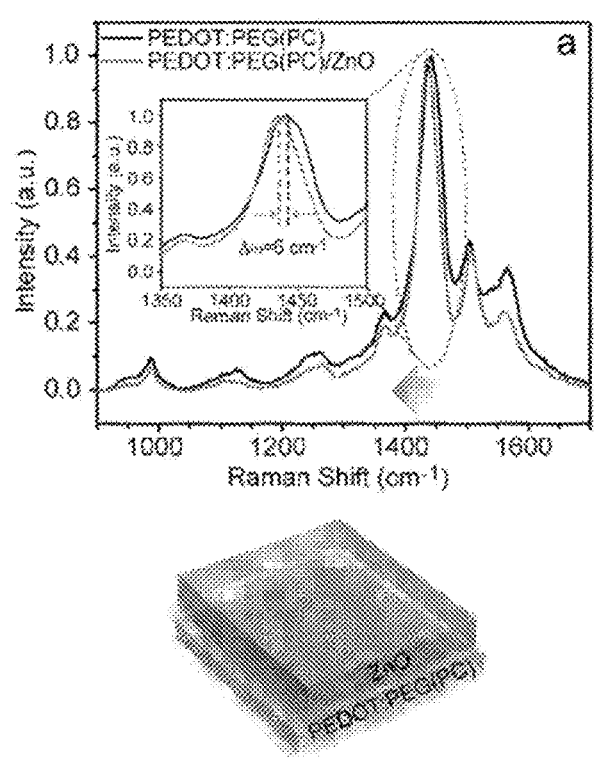
FIGS. 5A-5C show (a) Raman spectra of the PEDOT:PEG(PC) and PEDOT:PEG (PC)/ZnO with the peak P1 centered at 1441 $cm^{-1}$. The polymer is reduced upon interaction with ZnO, as evidenced by a decrease in frequency (red-shift by 6 $cm^{-1}$) at 1441 $cm^{-1}$. (b) Raman peak P1 is blue-shifted by 4 $cm^{-1}$ when in contact with graphene. (c) Raman peak P1 is red-shifted by 2 $cm^{-1}$ in the full graphene/PEDOT:PEG(PC)/ZnO system. In all of these plots, the intensities were normalized to their maximum values to compare the spectral features.

The above results demonstrated the broad applicability of this approach for growing well-ordered ZnO nanowires on a graphene surface via nondestructive modification with conductive polymeric interlayers. To elucidate possible interactions—such as doping via charge transfer—between graphene, the polymer interlayer (PEDOT:PEG(PC)), and the ZnO seed layer, resonant Raman spectroscopy analysis was performed (refs. 29-31). FIG. 5A shows the Raman spectra of PEDOT:PEG(PC) and PEDOT:PEG(PC)/ZnO samples within the frequency range that corresponds to carbon-carbon (C—C and C=C) stretch vibrations in the benzoid/quinoid structure present in a typical PEDOT system (refs. 29-31). The Raman spectra were fitted with Lorentzian curves, and the resulting fitting parameters are summarized in Table 1.

TABLE 1

| Sample | ω (cm$^{-1}$) | γ (cm$^{-1}$) |
| --- | --- | --- |
| PEDOT:PEG(PC) | 1441 | 42 |
| PEDOT:PEG(PC)/ZnO | 1435 | 36 |
| Graphene/PEDOT:PEG(PC) | 1445 | 48 |
| Graphene/PEDOT:PEG(PC)/ZnO | 1439 | 38 |

Figure 5B:
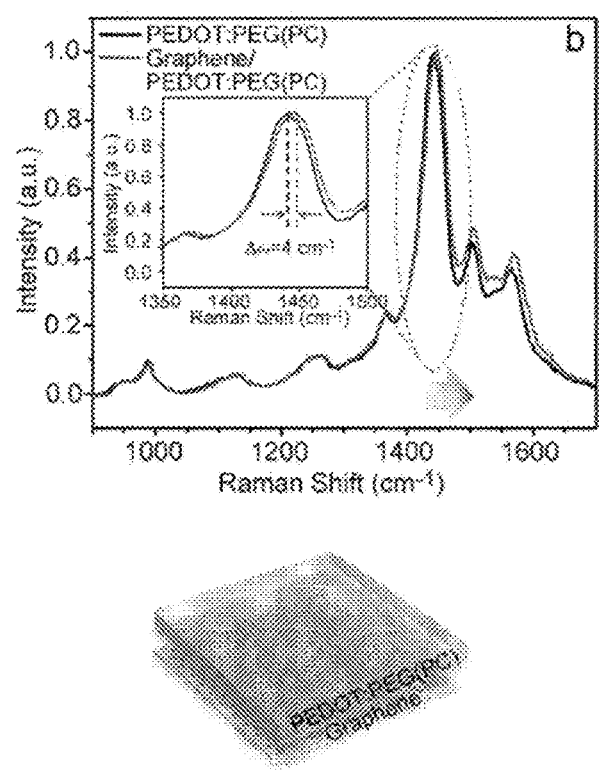
Figure 5C:
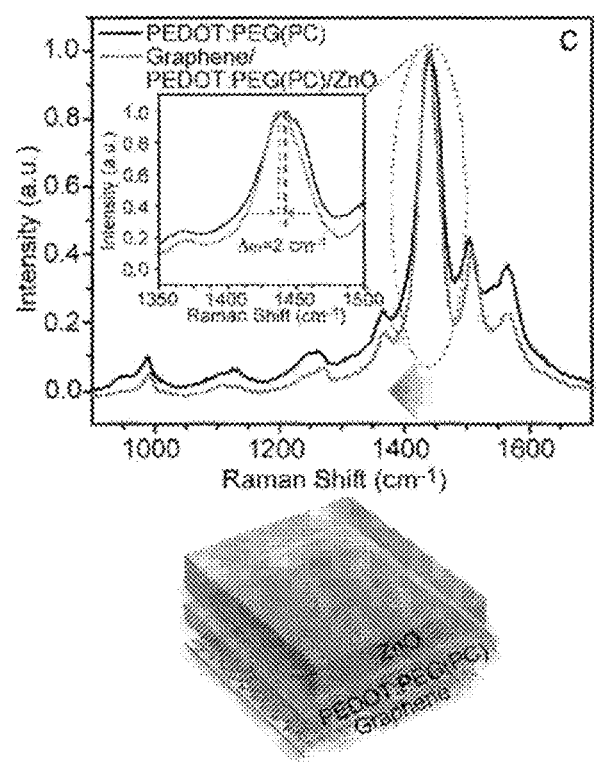

The strongest feature in the Raman spectrum of PEDOT:PEG(PC) was a peak centered at 1441 cm$^{-1}$ (P1) that was attributed to in-plane stretching of the C=C double bonds. The frequency of this Raman peak is known to be sensitive to the negative (reduction) and positive (oxidation) doping of the polymer; namely, reduction (oxidation) result in both a frequency red (blue) shift and linewidth narrowing (broadening) (refs. 29-31). Because of this sensitivity, we used peak P1 to investigate the potential interactions between PEDOT:PEG(PC), ZnO, and graphene. The peak P1 frequency for PEDOT:PEG(PC)/ZnO system was red-shifted by 6 cm$^{-1}$ relative to that of pristine PEDOT:PEG(PC), while the respective spectral linewidth narrowed by 6 cm$^{-1}$. Comparison of the Raman results with previously reported peak shifts and linewidths as a function of PEDOT:PSS doping (refs. 29-31) indicated that the polymer was reduced when in contact with ZnO. In contrast, when the PEDOT:PEG(PC) layer was in contact with graphene, peak P1 blue-shifted by 4 cm$^{-1}$ and its spectral linewidth broadened by 6 cm$^{-1}$ relative to that of the pristine graphene, indicating oxidation of the PEDOT:PEG(PC) (FIG. 5B). Finally, by measuring the P1 peak of the final graphene/PEDOT:PEG(PC)/ZnO system (FIG. 5C), it was observed that its frequency was red-shifted by 2 cm$^{-1}$ and the linewidth narrowed by 4 cm$^{-1}$ relative to that of pristine PEDOT:PEG (PC). This finding was in agreement with results on the individual two-component systems (graphene/PEDOT:PEG (PC) and PEDOT:PEG(PC)/ZnO)) because the reduction of the polymer caused by ZnO was more prominent than the oxidation caused by graphene. From these observations, it is expected that electrons transfer from ZnO to the conducting polymer PEDOT:PEG(PC) and ultimately to the graphene electrodes, as desired in a full device configuration.

After obtaining uniform arrays of ZnO nanowires on graphene, graphene cathode-based hybrid solar cells were fabricated using PbS quantum dots (QDs) (ref. 32) and P3HT as p-type hole-transporting donor materials and the ZnO nanowires as electron-transporting channels to the cathode. The as-grown graphene/ZnO nanowire structure was well-suited for an inverted device geometry, which offered improved stability over conventional ITO anode-based geometries by avoiding an acidic PEDOT:PSS layer and easily-oxidized low work function metals (e.g., Al or Ag) (ref. 33).

Figure 6:
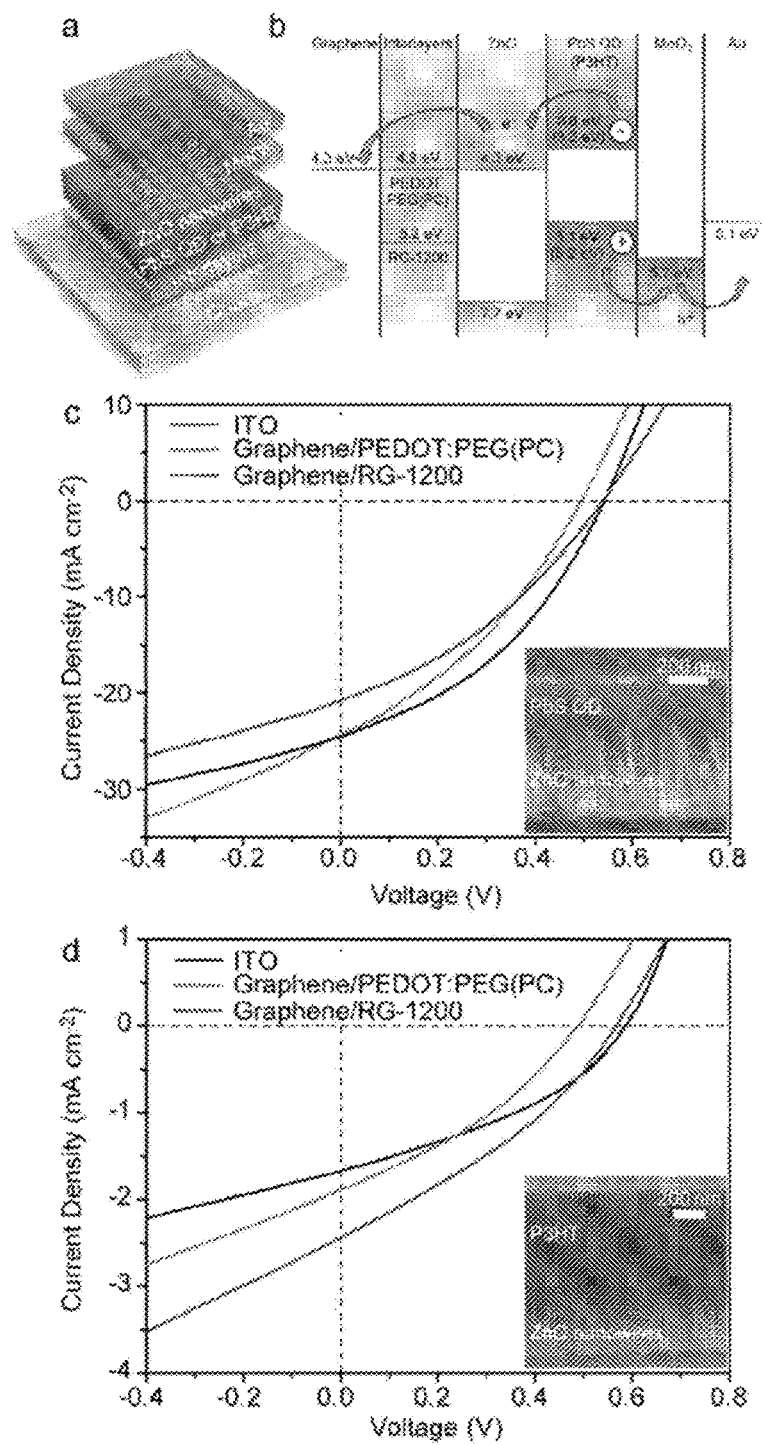
FIG. 6 represents Hybrid graphene/ZnO nanowire solar cells.

For both types of devices, prior to ZnO nanowire growth, graphene electrodes were treated with polymeric interlayers, whereas ITO electrodes were treated with oxygen plasma. Detailed fabrication and testing procedures are described below. FIGS. 6A and 6B show the overall device structure and the corresponding flat-band energy level diagram. Cross-sectional SEM images (FIGS. 6C and 6D insets) showed that the PbS QDs and P3HT infiltrated deep into the ZnO nanowire arrays, as desired for efficient charge separation (ref. 32). FIGS. 6C and 6D compare representative current density-voltage (J-V) characteristics under AM1.5G illumination at 100 mW/cm$^2$ of solar cells with graphene and ITO electrodes. With optimized ZnO nanowire growth conditions, efficient device performance was observed for both ITO and graphene electrodes in both device architectures: the power conversion efficiency (PCE) of PbS QD-based devices was 5.1% for ITO/ZnO, 4.2% for graphene/PEDOT:PEG(PC)/ZnO, and 3.9% for graphene/RG-1200/ZnO; the corresponding PCEs for P3HT-based devices were 0.4%, 0.3%, and 0.5%, respectively. The primary photovoltaic performance parameters are summarized in Table 2.

ordered ZnO nanowire arrays on graphene while preserving its electrical and structural properties.

Materials and Methods

Graphene synthesis and transfer. Graphene films were synthesized via low pressure chemical vapor deposition using copper foil (25 μm in thickness, ALFA AESAR) as a metal catalyst. The growth chamber was evacuated to a base pressure of 30-50 mTorr, heated to a growth temperature of 1000° C. under hydrogen gas (H$_2$, 10 sccm, ~320 mTorr), and annealed for 30 min. Subsequently, methane gas (CH$_4$, 20 sccm, total pressure: ~810 mTorr) was introduced and graphene growth was carried out for 30 min. The chamber was then cooled down at ~45° C./min to room temperature. Transfer of graphene from the growth substrate was performed using poly(methyl methacrylate) (PMMA, 950 A9, Microchem). Graphene on one side of the Cu foil was removed via reactive ion etching with oxygen gas (Plasma-Therm, 100 Watt at 7×10$^{-5}$ Torr) before the Cu was etched away (Cu etchant: CE-100, Transene). Graphene films were then thoroughly rinsed with hydrochloric acid (10%) and de-ionized (DI) water. Finally, the PMMA layer was removed by annealing at 500° C. for 2 h under H$_2$ (700 sccm) and Ar (400 sccm). Repeated transfers were performed to form three-layer graphene stacks.

Polymer interfacial layers. PEDOT:PEG (PC) (Sigma Aldrich) in nitromethane was filtered (0.2 μm), spin-coated in air at 5000 rpm for 60 s, and spin-dried in air. Plexcore® OC RG-1200 (Sigma Aldrich) in ethylene glycol monobutyl ether/water, 3:2 was filtered (0.45 μm), spin-coated in air at 4000 rpm for 60 s, and annealed at 175° C. for 30 min in air.

ZnO nanowires growth. ZnO nanowires were grown on PEDOT:PEG(PC) or RG-1200 by a hydrothermal method. ZnO seed layers were prepared by spin-coating 300 mM of zinc acetate dihydrate and ethanolamine in 2-methoxyethanol solution and annealing at 175° C. for 10 min. This process was repeated twice to form a uniform ZnO seed layer on PEDOT:PEG(PC) or RG-1200. The substrate was subsequently immersed into the nanowire growth solution for 40 min. The growth solution consisted of 50 mM zinc nitrate hexahydrate (25 ml) and 50 mM hexamethylenetetramine (25 ml) in DI water. As-grown ZnO nanowires were

TABLE 2

| Cathode | Interface layer | Electron transport layer | Photoactive material | $J_{SC}$ (mA/cm$^2$) | $V_{OC}$ (V) | FF (%) | PCE (%) |
|---|---|---|---|---|---|---|---|
| ITO | — | ZnO nanowire | PbS QD | 24.6 (24.3 ± 0.3) | 0.54 (0.49 ± 0.04) | 38.6 (36.3 ± 1.6) | 5.1 (4.4 ± 0.6) |
| Graphene | PEDOT:PEG (PC) | ZnO nanowire | PbS QD | 24.4 (22.5 ± 1.3) | 0.50 (0.49 ± 0.01) | 34.6 (34.4 ± 0.3) | 4.2 (3.8 ± 0.3) |
| Graphene | RG-1200 | ZnO nanowire | PbS QD | 20.8 (18.5 ± 1.9) | 0.54 (0.54 ± 0.01) | 34.9 (33.3 ± 3.2) | 3.9 (3.3 ± 0.6) |
| ITO | — | ZnO nanowire | P3HT | 1.7 (1.6 ± 0.1) | 0.59 (0.56 ± 0.04) | 36.8 (35.3 ± 1.8) | 0.4 (0.3 ± 0.1) |
| Graphene | PEDOT:PEG (PC) | ZnO nanowire | P3HT | 1.9 (1.6 ± 0.2) | 0.49 (0.46 ± 0.04) | 33.8 (32.2 ± 2.0) | 0.3 (0.2 ± 0.1) |
| Graphene | RG-1200 | ZnO nanowire | P3HT | 2.4 (1.9 ± 0.5) | 0.57 (0.50 ± 0.06) | 32.9 (29.8 ± 2.7) | 0.5 (0.3 ± 0.1) |

With graphene electrodes of only three stacked monolayers, the observed device performance approached that of ITO-based solar cells. Furthermore, for the ZnO nanowire-based P3HT architecture, the efficiencies achieved equaled or exceeded those reported previously for similar ITO-based devices (refs. 34-35). These results indicated that the proposed substrate-independent method for polymeric interfacial modification allowed the growth of high-quality and thoroughly rinsed in DI water and annealed at 200° C. for 5 min to remove residual DI water.

Structural characterization. The surface morphologies of graphene, PEDOT:PEG(PC), RG-1200, and ZnO seed layers were characterized using a Digital Instruments Veeco Dimension 3100 atomic force microscope operated in tapping mode. Scanning electron microscopy was performed with a Helios Nanolab 600 at 5 kV. Transmission electron microscopy (TEM) images and the corresponding electron diffraction patterns of as-prepared ZnO samples were obtained using a JEOL 2010F with an accelerating voltage of 200 kV.

Raman and optical analysis. Raman spectra were taken with a 532 nm wavelength laser source (Nd:YAG laser) in the backscattering geometry using a 100× objective. The laser power measured from the objective was 1.5 mW. PL measurement of the as-grown ZnO nanowires on seeded Si substrates was conducted at room temperature, with a laser operating at 262 nm and a power density of 60 W/cm$^2$.

Device fabrication. Pre-patterned ITO substrates (Thin Film Devices, 150 nm thick, 20 Ω/sq, 85% T) were cleaned by sonication in soap water (Micro-90, Cole-Parmer), DI water, acetone and isopropanol, followed by oxygen plasma cleaning (100 W, Plasma Preen, Inc.) for 30 s. Patterned graphene substrates were cleaned by annealing at 500° C. for 30 min under H$_2$ (700 sccm) and Ar (400 sccm).

ZnO-nanowire/P3HT hybrid solar cells. A solution of poly(3-hexylthiophene-2,5-diyl) (P3HT, Plexcore® OS 2100) in 1,2-dichlorobenzene (30 mg/ml) was prepared. Cyclohexanone (10 vol %) was then added into the P3HT solution, and the solution turned purple after 24 h, indicative of P3HT nanofiber formation. The polymer solution was spin-coated on ZnO nanowire arrays at 1000 rpm for 60 s in a nitrogen-filled glovebox. The substrates were annealed at 150° C. inside the glove box for 45 min to ensure the infiltration of P3HT nanofibers into the voids of nanowire arrays. MoO$_3$ (Alfa Aesar, 99.9995%) and the top anode Au (Kurt J. Lesker, 3.175 mm pallets, 99.999%) were thermally evaporated through shadow masks at a base pressure of 2×10$^{-6}$ Torr at rates of 1.0 Å/s and 1.5 Å/s, respectively. The device area defined by the overlap between the top and bottom electrodes was 1.21 mm$^2$.

ZnO-nanowire/PbS QD hybrid solar cells. Colloidal PbS QDs with the first excitonic peak at 905 nm (1.36 eV) were synthesized according to literature methods and deposited on ZnO nanowire by sequential layer-by-layer spin-casting, as reported elsewhere (refs. 32 and 36). Each spin-casting cycle deposited ~30 nm of QDs, with a typical film thickness of ~300 nm achieved through 10 deposition cycles. A 25 mg/mL solution of PbS QDs in octane (anhydrous, Sigma-Aldrich, 99+%) was spin-cast on ZnO films at 1500 rpm. Full exchange of 1,3-benzenedithiol (BDT) (Sigma-Aldrich, 99%) for the native oleic acid capping ligands was carried out by drop-casting a 1.7 mM solution of BDT in acetonitrile (anhydrous, Sigma-Aldrich, 99.8%) and waiting for 30 s before spin-drying. Films were then rinsed 3 times with acetonitrile to remove excess ligands. PbS QD and BDT solutions were dispensed through a 0.1 μm PTFE membrane filter. MoO$_3$ (Alfa Aesar, 99.9995%) and Au (Kurt J. Lesker, 3.175 mm pallets, 99.999%) were thermally evaporated through a shadow mask at 0.5 Å/s or 1.0 Å/s, respectively, at a base chamber pressure of 1×10$^{-6}$ Torr. All fabrication steps were carried out in inert nitrogen atmosphere to prevent oxidation of the QDs and the ligands.

Device Characterization. Current-voltage characteristics of the PV devices were recorded in a nitrogen-filled glovebox using a computer-controlled Keithley 6487 picoammeter source-meter. 100 mW/cm$^2$ illumination was provided by a 150 W xenon arc-lamp (Newport 96000) equipped with an AM 1.5G filter. The specular transmittance spectra of polymers were measured on quartz substrates with a Cary 5000 UV-Vis-NIR dual-beam spectrophotometer. Sheet resistance was measured using a RM3-AR four point probe station from Jandel Engineering LTD.

REFERENCES

Each of the following references is incorporated by reference.

1. Novoselov, K. S.; Jiang, D.; Schedin, F.; Booth, T. J.; Khotkevich, V. V.; Morozov, S. V.; Geim, A. K. P. *Natl. Acad. Sci. USA* 2005, 102, (30), 10451-10453.
2. Reina, A.; Jia, X. T.; Ho, J.; Nezich, D.; Son, H. B.; Bulovic, V.; Dresselhaus, M. S.; Kong, J. *Nano Lett.* 2009, 9, (1), 30-35.
3. Li, X. S.; Cai, W. W.; An, J. H.; Kim, S.; Nah, J.; Yang, D. X.; Piner, R.; Velamakanni, A.; Jung, I.; Tutuc, E.; Banerjee, S. K.; Colombo, L.; Ruoff, R. S. *Science* 2009, 324, (5932), 1312-1314.
4. Geim, A. K.; Novoselov, K. S. *Nat. Mater.* 2007, 6, (3), 183-191.
5. Berger, C.; Song, Z. M.; Li, X. B.; Wu, X. S.; Brown, N.; Naud, C.; Mayou, D.; Li, T. B.; Hass, J.; Marchenkov, A. N.; Conrad, E. H.; First, P. N.; de Heer, W. A. *Science* 2006, 312, (5777), 1191-1196.
6. Bolotin, K. I.; Sikes, K. J.; Jiang, Z.; Klima, M.; Fudenberg, G.; Hone, J.; Kim, P.; Stormer, H. L. *Solid State Commun.* 2008, 146, (9-10), 351-355.
7. Wang, X. R.; Li, X. L.; Zhang, L.; Yoon, Y.; Weber, P. K.; Wang, H. L.; Guo, J.; Dai, H. J. *Science* 2009, 324, (5928), 768-771.
8. Bonaccorso, F.; Sun, Z.; Hasan, T.; Ferrari, A. C. *Nat. Photonics* 2010, 4, (9), 611-622.
9. Park, H.; Brown, P. R.; Buloyic, V.; Kong, J. *Nano Lett.* 2012, 12, (1), 133-140.
10. De Arco, L. G.; Zhang, Y.; Schlenker, C. W.; Ryu, K.; Thompson, M. E.; Zhou, C. W. *Acs Nano* 2010, 4, (5), 2865-2873.
11. Wang, Y.; Tong, S. W.; Xu, X. F.; Ozyilmaz, B.; Loh, K. P. *Adv. Mater.* 2011, 23, (13), 1514-1518.
12. Han, T.; Lee, Y.; Choi, M.; Woo, S.; Bae, S.; Hong, B.; Ahn, J.; Lee, T. *Nat. Photonics* 2012, 6, 105-110.
13. Chung, K.; Lee, C.-H.; Yi, G.-C. *Science* 2010, 330, (6004), 655-657.
14. Bae, S.; Kim, H.; Lee, Y.; Xu, X. F.; Park, J.-S.; Zheng, Y.; Balakrishnan, J.; Lei, T.; Ri Kim, H.; Song, Y. I.; Kim, Y.-J.; Kim, K. S.; Ozyilmaz, B.; Ahn, J.-H.; Hong, B. H.; Iijima, S. *Nat. Nanotechnol.* 2010, 5, (8), 574-578.
15. Savage, N. *Nature* 2012, 483, (7389), S38-S39.
16. Law, M.; Goldberger, J.; Yang, P. D. *Ann. Rev. Mater. Res.* 2004, 34, 83-122.
17. Ren, S.; Zhao, N.; Crawford, S. C.; Tambe, M.; Bulović, V.; Gradečak, S. *Nano Lett.* 2010, 11, (2), 408-413.
18. Ren, S.; Chang, L.-Y.; Lim, S.-K.; Zhao, J.; Smith, M.; Zhao, N.; Bulović, V.; Bawendi, M. G.; Gradečak, S. *Nano Lett.* 2011, 11, (9), 3998-4002.
19. Kim, Y.-J.; Lee, J.-H.; Yi, G.-C. *Appl. Phys. Lett.* 2009, 95, (21), 213101-3.
20. Shin, K.-S.; Jo, H.; Shin, H.-J.; Choi, W. M.; Choi, J.-Y.; Kim, S.-W. *J. Mater. Chem.* 2012, 22, (26), 13032-13038.
21. Choi, W. M.; Shin, K. S.; Lee, H. S.; Choi, D.; Kim, K.; Shin, H. J.; Yoon, S. M.; Choi, J. Y.; Kim, S. W. *Nano Research* 2011, 4, (5), 440-447.
22. Greene, L. E.; Law, M.; Tan, D. H.; Montano, M.; Goldberger, J.; Somorjai, G.; Yang, P. D. *Nano Lett.* 2005, 5, (7), 1231-1236.
23. Brewster, M. M.; Zhou, X.; Lu, M.-Y.; Gradečak, S. *Nanoscale* 2011, 4, (5), 1455-1462.

24. Ruankham, P.; Macaraig, L.; Sagawa, T.; Nakazumi, H.; Yoshikawa, S. *J. Phys. Chem. C* 2011, 115, (48), 23809-23816.

25. Munshi, A. M.; Dheeraj, D. L.; Fauske, V. T.; Kim, D.-C.; van Helvoort, A. T. J.; Fimland, B.-O.; Weman, H. *Nano Lett.* 2012, 12, (9), 4570-4576.

26. Wang, S. R.; Zhang, Y.; Abidi, N.; Cabrales, L. *Langmuir* 2009, 25, (18), 11078-11081.

27. Park, H.; Chang, S.; Smith, M.; Gradečak, S.; Kong, J. 2012, in preparation.

28. Skotheim, T. A.; Reynolds, J. R., *Handbook of Conducting Polymers.* CRC press: Boca Raton, 2007.

29. de Kok, M. M.; Buechel, M.; Vulto, S. I. E.; van de Weijer, P.; Meulenkamp, E. A.; de Winter, S.; Mank, A. J. G.; Vorstenbosch, H. J. M.; Weijtens, C. H. L.; van Elsbergen, V. *Phys. Status Solidi A* 2004, 201, (6), 1342-1359.

30. Chiu, W. W.; Travas-Sejdic, J.; Cooney, R. P.; Bowmaker, G. A. *J. Raman Spectrosc.* 2006, 37, (12), 1354-1361.

31. Sakamoto, S.; Okumura, M.; Zhao, Z.; Furukawa, Y. *Chem. Phys. Lett.* 2005, 412, (4-6), 395-398.

32. Jean, J.; Chang, S.; Brown, P. R.; Cheng, J. W. J.; Bawendi, M. G.; Gradečak, S.; Bulović, V. *Adv. Mater.* 2012, Submitted.

33. Zhang, F.; Xu, X.; Tang, W.; Zhang, J.; Zhuo, Z.; Wang, J.; Wang, J.; Xu, Z.; Wang, Y. *Sol. Energy Mater. Sol. Cells* 2011, 95, (7), 1785-1799.

34. Olson, D. C.; Lee, Y.-J.; White, M. S.; Kopidakis, N.; Shaheen, S. E.; Ginley, D. S.; Voigt, J. A.; Hsu, J. W. P. *J. Phys. Chem. C* 2007, 111, (44), 16640-16645.

35. Yin, Z.; Wu, S.; Zhou, X.; Huang, X.; Zhang, Q.; Boey, F.; Zhang, H. *Small* 2010, 6, (2), 307-312.

36. Zhao, N.; Osedach, T. P.; Chang, L.-Y.; Geyer, S. M.; Wanger, D.; Binda, M. T.; Arango, A. C.; Bawendi, M. G.; Bulović, V. *ACS Nano* 2010, 4, (7), 3743-3752.

Other embodiments are within the scope of the following claims.

What is claimed is:

1. A transparent electrode comprising:
   a graphene sheet on a substrate;
   an interlayer including a conductive polymer disposed over the graphene sheet wherein the interlayer includes a polythiophene, the interlayer modifying the graphene to enhance chemical compatibility between the graphene and a semiconducting nanowire while maintaining the graphene's electrical and structural properties; and
   a plurality of semiconducting nanowires disposed over the interlayer.

2. The transparent electrode of claim 1, wherein the plurality of semiconducting nanowires are substantially parallel to one another.

3. The transparent electrode of claim 2, wherein the long axes of plurality of semiconducting nanowires are substantially perpendicular to the graphene sheet.

4. The transparent electrode of claim 1, wherein the plurality of semiconducting nanowires comprise ZnO.

5. A device comprising the transparent electrode of claim 1, further comprising a photoactive material disposed over the plurality of semiconducting nanowires.

6. The device of claim 5, wherein the photoactive material includes semiconductor nanocrystals or P3HT.

7. The device of claim 5, further comprising a second electrode deposited over the photoactive material.

8. A method of making a transparent electrode comprising:
   providing a graphene sheet on a substrate;
   depositing an interlayer including a conductive polymer disposed over the graphene sheet wherein the interlayer includes a polythiophene; and
   growing a plurality of semiconducting nanowires over the interlayer and modifying the graphene to enhance chemical compatibility between the graphene and a semiconducting nanowire while maintaining the graphene's electrical and structural properties.

9. The method of claim 8, wherein depositing the interlayer includes spin-casting.

10. The method of claim 8, wherein growing the plurality of semiconducting nanowires over the interlayer includes a hydrothermal deposition.

11. The method of claim 8, wherein the plurality of semiconducting nanowires comprise ZnO.

12. The method of claim 8, wherein the interlayer includes a polythiophene derivative.

13. A method of making a device including the method of claim 8, further comprising depositing a photoactive material disposed over the plurality of semiconducting nanowires.

14. The method of claim 13, wherein the photoactive material includes semiconductor nanocrystals or P3HT.

15. The method of claim 13, further comprising depositing a second electrode over the photoactive material.

16. A photovoltaic device comprising
   a graphene sheet on a substrate;
   an interlayer including a conductive polymer disposed over the graphene sheet wherein the interlayer includes a polythiophene, the interlayer modifying the graphene to enhance chemical compatibility between the graphene and a semiconducting nanowire while maintaining the graphene's electrical and structural properties; and
   a plurality of semiconducting nanowires disposed over the interlayer.

17. The photovoltaic device of claim 16, further comprising a photoactive material disposed over the plurality of semiconducting nanowires.

18. The photovoltaic device of claim 16, wherein the plurality of semiconducting nanowires comprise ZnO.

19. A method of generating electricity, comprising illuminating the photovoltaic device of claim 16.

* * * * *